United States Patent [19]

Block

[11] 4,311,419
[45] Jan. 19, 1982

[54] METHOD FOR DRILLING CIRCUIT BOARDS

[75] Inventor: James P. Block, Long Beach, Calif.

[73] Assignee: LCOA Laminating Company of America, Garden Grove, Calif.

[21] Appl. No.: 61,594

[22] Filed: Jul. 30, 1979

[51] Int. Cl.³ .............................................. B23B 35/00
[52] U.S. Cl. ....................................... 408/1 R; 83/658
[58] Field of Search ................. 408/1 R; 83/451, 658; 428/433, 438, 464, 901

[56] References Cited

U.S. PATENT DOCUMENTS 3,700,341 10/1972 Block ........................................ 408/1
4,019,826 4/1977 Block .................................... 408/1 R Primary Examiner—Z. R. Bilinsky
Attorney, Agent, or Firm—Edward A. Sokolski

[57] ABSTRACT

An entry material for use in drilling circuit boards to avoid marring of such boards comprises a wood pulp-glass composite substrate having aluminum foil bonded to the opposite surfaces thereof. This entry material is relatively economical and has a stiffness sufficient to avoid upward bending or "oil canning" when pressure feet spaced from the drill are employed to hold the workpiece during drilling and further has enough strength to withstand high torsional drill forces with drills operating for high rates of material removal. The double layers of foil separated by the low heat conductive substrate material affords a pair of heat sinks which more effectively can carry away heat from the drill.

5 Claims, 4 Drawing Figures

METHOD FOR DRILLING CIRCUIT BOARDS

This invention relates to the fabrication of printed circuit boards, and more particularly to an improved entry material and method for the drilling of such boards.

In manufacturing printed circuit boards for use in electrical and electronic equipment, many holes are drilled through these boards to accommodate component leads and support members. If the drill is applied directly to the surface of the board, it has been found that certain intolerable imperfections appear in the board surfaces, such as drill entry burrs, pressure foot marks from the pressure feet which are used for holding the workpiece in position during the drilling operation, and marks from particles which fall from the drill onto the surface of the boards which with contact on this surface of the pressure foot or drill bushing become driven into the surface of the board. Further, drill wander is often encountered when the drill strikes the surface of the board resulting in misalignment of the drilled hole.

To alleviate this problem, the use of an entry foil has been resorted to, as described in my U.S. Pat. No. 4,019,826, dated Apr. 26, 1977. While the use of this type of entry foil has greatly reduced the aforementioned problems, in certain instances difficulties are encountered, particularly in situations where the pressure foot for holding the workpiece in place during drilling is placed some distance from the drill. In such instances, a portion of the entry foil in the area of the drill tends to lift off the workpiece in an "oil canning" effect, causing drill debris to get between it and the printed circuit board, thereby diminishing, if not entirely defeating, the desired effects of the entry foil. It has also been found that with the use of drills which operate at higher r.p.m. and feed rates to more rapidly remove material, the relatively thin (5 mil.) entry foil is not strong enough to support such high torsional forces. While this problem could be alleviated by using a thicker foil, this would greatly increase the cost of the entry material and cause the generation of greater heat with its resultant increased wear on the drill bit.

The entry material employed in the present invention overcomes the aforementioned shortcomings of the prior art by providing a high strength entry material that is not subject to the aforementioned "oil canning" effect and can withstand high r.p.m., high feed rate drilling. This end result is achieved at a substantially lower cost than would be incurred were an entry sheet thick enough to have similar properties to be used. In addition, the entry material of the present invention provides more efficient heat sink cooling action for the drill than afforded with prior art entry foils. This end result is achieved by employing a substrate sheet made of a wood pulp-glass composite, flat sheets of aluminum foil being bonded to the opposite flat surfaces of this substrate with a suitable epoxy bonding agent. Optimum thicknesses of the various sheets and bonding techniques for joining them together have been developed to provide an integrated entry material having optimum characteristics and which is relatively economical.

It is therefore an object of this invention to provide an improved entry material for use in drilling printed circuit boards.

It is a further object of this invention to provide an entry material for use in drilling printed circuit boards which is not subject to "oil canning" effect and which can handle high r.p.m. and high feed rate drilling.

It is a further object of this invention to provide an entry material for use in drilling printed circuit boards which has improved heat sink properties for reducing the temperature of the drill.

Other objects of this invention will become apparent as the description proceeds in connection with the accompanying drawings of which:

Figure 1:
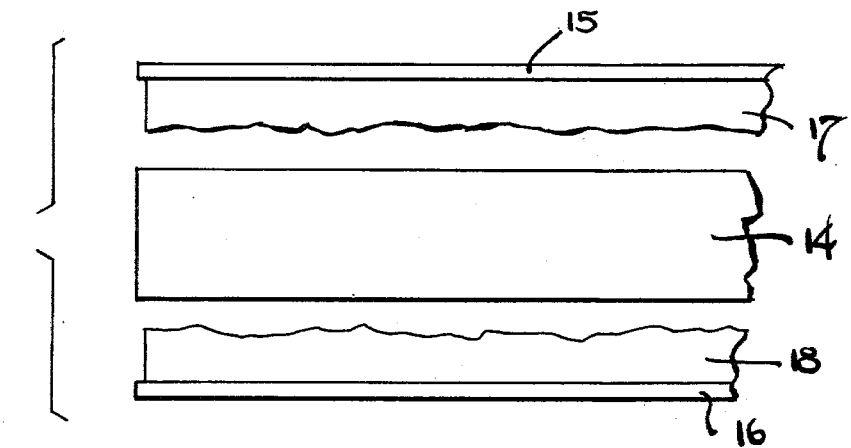
FIG. 1 is an exploded view of a preferred embodiment of the entry material of the invention.

Referring now to FIG. 1, the components of a preferred embodiment of the entry material of the invention are shown in exploded form. A substrate or core sheet 14 has sheets of aluminum 15 and 16 bonded to the opposite surfaces thereof by means of layers of epoxy bonding agent 17 and 18. Substrate or core 14 is fabricated of a hardwood pulp fiberglass composite which preferably is formed from 70% hardwood pulp and 30% unwoven glass fiber. Substrate 14 may be between 0.010 and 0.125 inches thick with 0.018 inches having been found to be optimum thickness for most application requirements. Foil sheets 15 and 16 are preferably of aluminum with type 3003-H-19 commercially available foil having been found ideal. This foil is composed of 0.6% silicon, 0.7% iron, 0.05–0.20% copper, 1.0–1.5% maganese, 0.10% zinc, and the remainder pure aluminum. The thickness of the aluminum foil sheets may be between 0.001 and 0.007 inches, an optimum thickness being 0.002 inches. Adhesive layers 17 and 18 are preferably 0.0065 inches in thickness, but may be between 0.001 and 0.020 inches.

Figure 2:
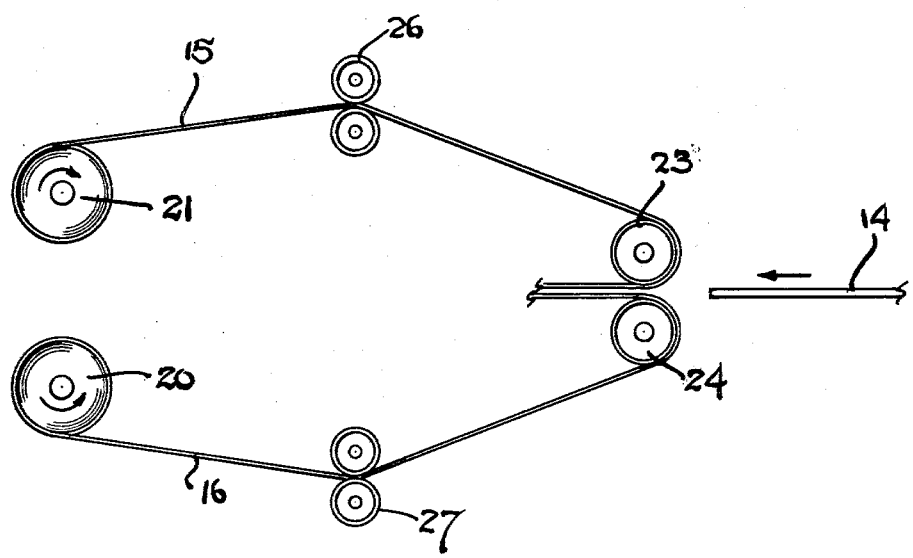
FIG. 2 is a schematic drawing illustrating the fabrication of the entry material of the invention.

Referring now to FIG. 2, the fabrication of the entry material of the invention is schematically illustrated. Aluminum foil 15 and 16 is drawn off rolls of such foil 20 and 21 by means of pinch rollers 23 and 24 through which the foil is drawn. Between the pinch rollers 23 and 24 and rolls 20 and 21, the foil passes over adhesive coating rollers 26 and 27 which coat the outer surfaces of the foil with an epoxy bonding agent. A sheet of the core or substrate 14 is passed through pinch rollers 23 and 24 between foil sheets 15 and 16 which are adhered to the opposite surfaces thereof. Typically, core sections about 38"×50" are used and the foil and core after being bonded together are cut along the edges to provide a board 36"×48". The bonding agent employed is an epoxy bonding agent formed from 50 % epoxy resin and 50% hardener which is layered onto the surface of the aluminum sheets to a thickness of 0.006–0.007 inches. The substrate 14, as already mentioned, is preferably a 70% hardwood pulp—30% fiberglass composite having a thickness of 0.018 inches, and the aluminum foil is type 3003-H19 aluminum, 0.002 thick. After the aluminum sheets have been adhered to substrate 14 and cut along the edges of such substrate, the material thus formed is placed between a pair of tooling or "caul" plates which are placed into a heated laminating press where heat and pressure are applied to the plates. In this process, the epoxy bonding agent thoroughly impregnates the substrate material. Typically, 50 psi is applied at about 210° F. for about 2 minutes to thoroughly flatten, cure and laminate the material. The entry material of the preferred embodiment has an overall thickness of 0.035 inches prior to placement in the press but after heat and pressure have been applied ends up with an overall thickness of 0.015 inches.

Figure 3:
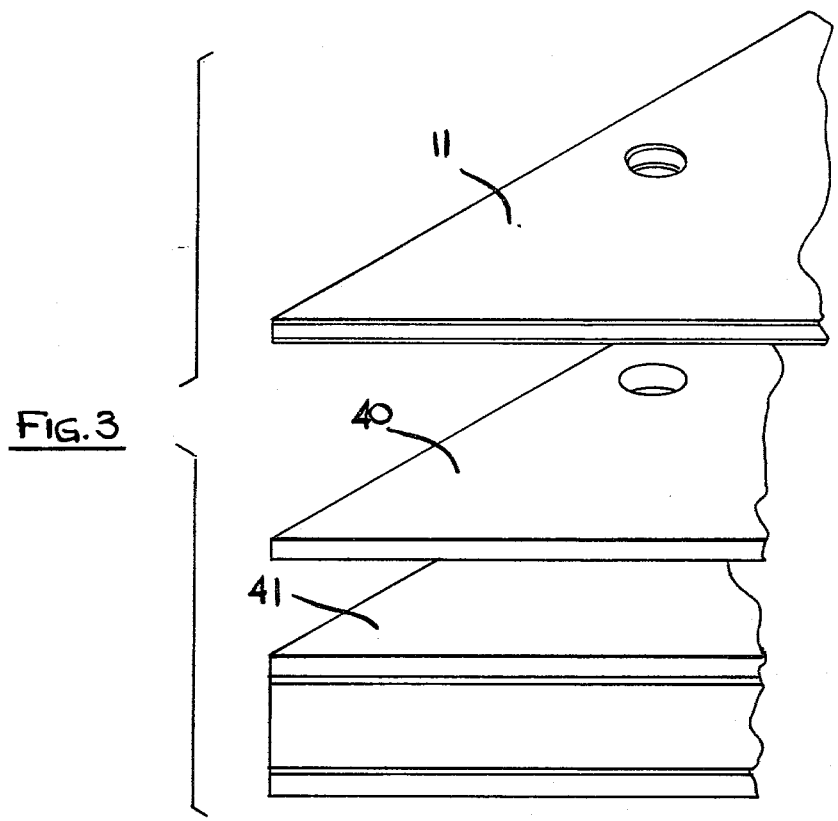
FIG. 3 is an exploded view illustrating the use of the entry material of the invention.
Figure 4:
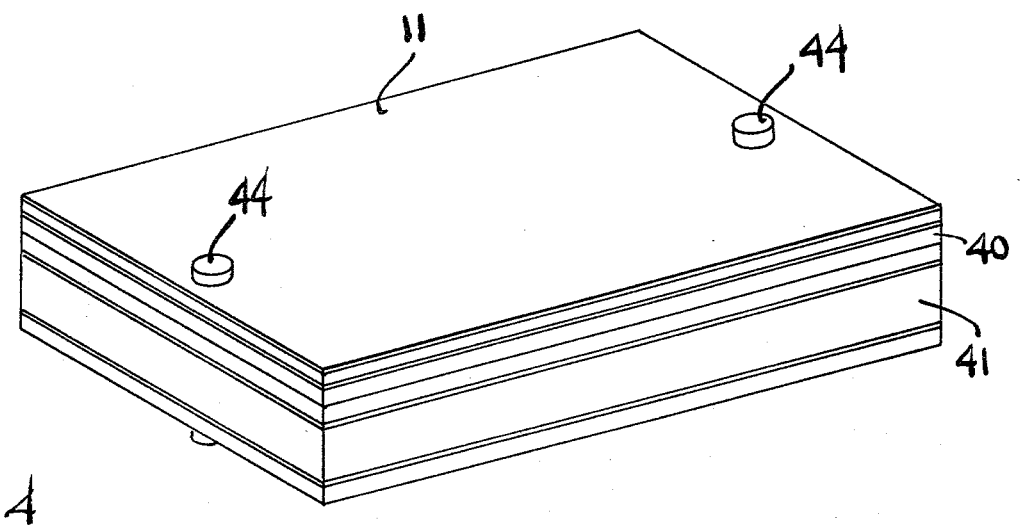
FIG. 4 is a perspective view further illustrating the use of the entry material of the invention.

Referring now to FIGS. 3 and 4, the use of the entry material in the drilling of a printed circuit board is illustrated. Circuit board 40 to be drilled is held against back-up board 41 which may be of the type of board described in my U.S. Pat. No. 3,700,341 by means of dowel pins 44. The unit is then placed in the drill machine for the drilling operation.

While the invention has been described and illustrated in detail, it is clearly to be understood that this is intended by way of illustration and example only and is not to be taken by way of limitation, the spirit and scope of this invention being limited only by the terms of the following claims.

I claim:

1. A method for drilling a printed circuit board comprising
   placing a laminated sheet of entry material on top of said printed circuit board, said entry material being formed from a substrate of a wood pulp-fiberglass composite having a thickness of 0.010–0.125 inches and sheets of aluminum foil bonded to the opposite surfaces of said substrate, said aluminum foil having a thickness of 0.001–0.007 inches, and
   drilling through the entry material and printed circuit board in succession.

2. The method of claim 1 wherein the aluminum foil is bonded to said substrate with an epoxy bonding agent comprised of 50% epoxy resin and 50% hardener which is layered between the foil and the substrate to a thickness of 0.006–0.007 inches.

3. The method of claims 1 or 2 wherein the aluminum foil has a thickness of 0.002 inches and the substrate has a thickness of 0.018 inches.

4. The method of claim 2 wherein after the bonding agent has been applied, heat is applied to the foil and substrate while the foil is compressed against the substrate so as to cause the bonding agent to thoroughly impregnate the substrate.

5. The method of claim 1 wherein the substrate is fabricated of a 70% hardwood pulp—30% fiberglass composite.

* * * * *